US009852805B2

United States Patent
Luan et al.

(10) Patent No.: US 9,852,805 B2
(45) Date of Patent: Dec. 26, 2017

(54) WRITE ENHANCEMENT FOR ONE TIME PROGRAMMABLE (OTP) SEMICONDUCTORS

(71) Applicant: Kilopass Technology, Inc., San Jose, CA (US)

(72) Inventors: Harry Luan, Saratoga, CA (US); Tao Su, Sunnyvale, CA (US); Steve Wang, Fremont, CA (US); Charlie Cheng, Los Altos, CA (US)

(73) Assignee: Kilopass Technology, Inc., San Jose, CA (US)

( * ) Notice: Subject to any disclaimer, the term of this patent is extended or adjusted under 35 U.S.C. 154(b) by 0 days.

(21) Appl. No.: 15/154,911

(22) Filed: May 13, 2016

(65) Prior Publication Data
US 2016/0379720 A1    Dec. 29, 2016

Related U.S. Application Data

(60) Provisional application No. 62/184,795, filed on Jun. 25, 2015.

(51) Int. Cl.
*G11C 17/16*    (2006.01)
*G11C 17/18*    (2006.01)

(52) U.S. Cl.
CPC .............. *G11C 17/18* (2013.01); *G11C 17/16* (2013.01)

(58) Field of Classification Search
CPC ....... G11C 17/16; G11C 8/08; G11C 13/0069; G11C 8/12; G11C 2213/72; G11C 8/14; G11C 11/404; G11C 7/1048; G11C 7/18
See application file for complete search history.

(56) References Cited

U.S. PATENT DOCUMENTS

| 7,471,540 | B2* | 12/2008 | Luan | G11C 11/404 |
| | | | | 257/E27.081 |
| 9,165,631 | B2* | 10/2015 | Kim | G11C 11/1675 |
| 9,373,410 | B1* | 6/2016 | Kumar | G11C 17/146 |
| 2015/0302932 | A1* | 10/2015 | Yanagisawa | G11C 13/0069 |
| | | | | 365/96 |

* cited by examiner

*Primary Examiner* — Hien Nguyen
(74) *Attorney, Agent, or Firm* — Aka Chan LLP

(57) ABSTRACT

A method of programming one-time programmable (OTP) memory cells in an array is described. Each memory cell has a MOSFET programming element and a MOSFET pass transistor, the MOSFET pass transistor having a gate electrode over a channel region between two source/drain regions, and the MOSFET programming element having a gate electrode over a channel region contiguous to a source/drain region either part of, or connected to, one of the two source/drains associated with the MOSFET pass transistor. The other source/drain region of the MOSFET pass transistor is coupled to a bit line. The memory cell is programmed by setting a first voltage of a first polarity on the gate electrode of the pass transistor to electrically connect the source/drain regions of the pass transistor; setting a second voltage of the first polarity on the gate electrode of the programming element; and setting a third voltage of a second polarity on the bit line. The voltage across an oxide layer between the gate electrode and channel region of the programming element ruptures the oxide layer and effectively programs the programming element.

19 Claims, 8 Drawing Sheets

WRITE ENHANCEMENT FOR ONE TIME PROGRAMMABLE (OTP) SEMICONDUCTORS

CROSS-REFERENCE TO RELATED APPLICATIONS

This patent application claims the benefit of U.S. Provisional Patent Application No. 62/184,795, filed Jun. 25, 2015, which is incorporated by reference along with all other references cited in this application.

BACKGROUND OF THE INVENTION

This invention relates to one-time programmable (OTP) semiconductor devices, such as described in U.S. Pat. Nos. 7,471,540 and 7,623,368, both of which are assigned to the present assignee and incorporated by reference herein for all purposes. The memory cell of such devices is arranged in an array of bit lines running in one direction and word lines running in a direction perpendicular to the bit lines. Each memory cell has a pass MOSFET (Metal-Oxide-Semiconductor Field Effect Transistor) and a programmable element in the form of a second (MOSFET) transistor as shown in a cross-sectional view of FIG. 1A. The pass or select transistor is formed by a gate electrode 17 slightly removed from and spanning two N+ source/drain regions 13 and 14 located in a semiconductor body 12 of P-conductivity. The gate electrodes, such as electrode 17, can be formed by many different conductive materials including, e.g., doped polysilicon, metals (such as tungsten and tantalum), silicides (alloys of metal and polysilicon), and other materials and combinations of materials, which are well known in the semiconductor processing field. A thin insulating oxide layer 19, called a gate oxide, separates the body 12 and N+ regions 13 and 14 from the gate electrode 17. The two source/drain regions 13 and 14 and the gate electrode 17 define a channel region on the top of the body 12 for the pass transistor. The N+ source/drain region 13 is connected to a bit line and the N+ source/drain region 14 forms a source/drain region of a second MOSFET transistor, the programmable element. A second N+ source/drain region 15 which is electrically floating, is part of the second MOSFET transistor which has a gate electrode 16 slightly removed from and spanning the two N+ source/drain region 14 and 15. A thin insulating gate oxide layer 18 separates the body 12 and N+ regions 14 and 15 from the gate electrode 16. The two source/drain regions 14 and 15 and the gate electrode 16 define a channel region on the top of the body 12 for the programmable element.

The particular MOSFET technology shown in this example is a SOI (Silicon-On-Insulator) process and the P-type body 12 rests on an insulating BOX (Body OXide) layer 11 which in turn rests on a semiconductor substrate 10. The above-cited patents also disclose that OTP memory cells can be formed by other semiconductor processes, such as illustrated in FIG. 1B. Here the N+ source/drain regions of the MOSFET transistors are formed in a P-type body, a P-well which is located in a deep N-type well on a P-type substrate. The same reference numerals in FIG. 1A are used for similar regions in FIG. 1B. Reverse-biased PN junctions provide electrical isolation for the bulk/body regions 12 in FIG. 1B in contrast to the isolation provided to the body regions 12 by the BOX layer 11. Reference is made to the patents for further details of the different structures of the OTP memory cells which should not considered limitations of the present invention.

Each memory cell stores a bit of information, a "1" or a "0," depending on whether the cell has been programmed or not. The particular correspondence between the value of a bit and whether the cell is programmed or not is arbitrarily defined. Programming is performed by the breakdown or rupture of the gate oxide 18 of the programming element, the second transistor. With the breakdown of the gate oxide 18, a conducting plug is formed through the gate oxide 18 to form a programmed connection between the gate electrode 16 and the N+ source/drain region 14 and/or the underlying body 12. Since a cell is programmed by creating an electrical connection, the described memory cells are sometimes called "anti-fuse" OTP cells.

A problem addressed by the cited patents is the variance in the quality of the programmed connection. Gate oxide breakdown can vary widely with unwelcome decreased conductivity and large variations in the conductivity of the memory cells of an array. The cited patents teach improvements in the gate oxide breakdown by, among other things, controlling the electric field in the programming process by controlling the bias of the body 12. Nonetheless, despite the improved programming results, it is still highly desirable that continued improvements in the programmed connections be achieved.

BRIEF SUMMARY OF THE INVENTION

The present invention provides for a method of programming a memory cell having a programmable element and a pass transistor connected in series to a bit line. The method comprises: setting a first voltage of a first polarity on a first gate electrode of the programming element; setting a second voltage of the first polarity on a second gate electrode of the pass transistor; and setting a third voltage on a bit line connected to the pass transistor, the third voltage of a second polarity opposite the first polarity; and rupturing an oxide layer between the first gate electrode and a channel region of the programmable element.

The present invention also provides for a method of programming a memory cell in an array of one-time programmable (OTP) memory cells, each memory cell having a MOSFET pass transistor with a gate electrode over a channel region between two source/drain regions, and a MOSFET programming element with a gate electrode over a channel region contiguous to a source/drain region which is either part of, or connected to, one of the two source/drains associated with the MOSFET pass transistor, the other source/drain region of the MOSFET pass transistor coupled to a bit line. The method comprises: setting a first voltage of a first polarity on the gate electrode of the pass transistor to electrically connect the source/drain regions of the pass transistor; setting a second voltage of the first polarity on the gate electrode of the programming element; and setting a third voltage of a second polarity on the bit line whereby a voltage across an oxide layer between the gate electrode and channel region of the programming element is created to rupture the oxide layer and program the programming element. Furthermore, the first polarity of the first and second voltages is positive and the second polarity of the third voltage is negative.

The present invention provides for a semiconductor device comprising: an array of one-time programmable (OTP) memory cells, each memory cell having a MOSFET pass transistor having two source/drain regions and a gate electrode over a channel region between the two source/drain regions; a MOSFET programming element having two source/drain regions and a gate electrode over a channel region between the two source/drain regions, one of the source/drain regions either part of, or connected to, one of the two source/drains associated with the MOSFET pass transistor; a first word line connected to the gate of the MOSFET pass transistor; a second word line connected to the gate electrode of the MOSFET programming element; a bit line connected to the source/drain region of the MOSFET pass transistor not part of, nor connected to, a source/drain region of the MOSFET programming element; and a negative voltage source coupled to the bit line during programming of the memory cell.

Other objects, features, and advantages of the present invention will become apparent upon consideration of the following detailed description and the accompanying drawings, in which like reference designations represent like features throughout the figures.

DETAILED DESCRIPTION OF THE INVENTION

Up to the present, positive voltage biasing has been used to program such anti-fuse OTP cells for ease of design and area efficiency. Existing circuits already operate between ground and some positive voltage so it has been easy to adapt the circuits for programming. The need for additional circuitry and the area occupied by the circuitry is removed. Area saving is always an important consideration in semiconductor design. However, the result is a relative high turn-on voltage and therefore requires high-voltage circuits and power supply. As power is proportional to the square of the voltage, this is a poor design trade-off for emerging low power applications which use small batteries and energy harvesting techniques.

Figure 2:
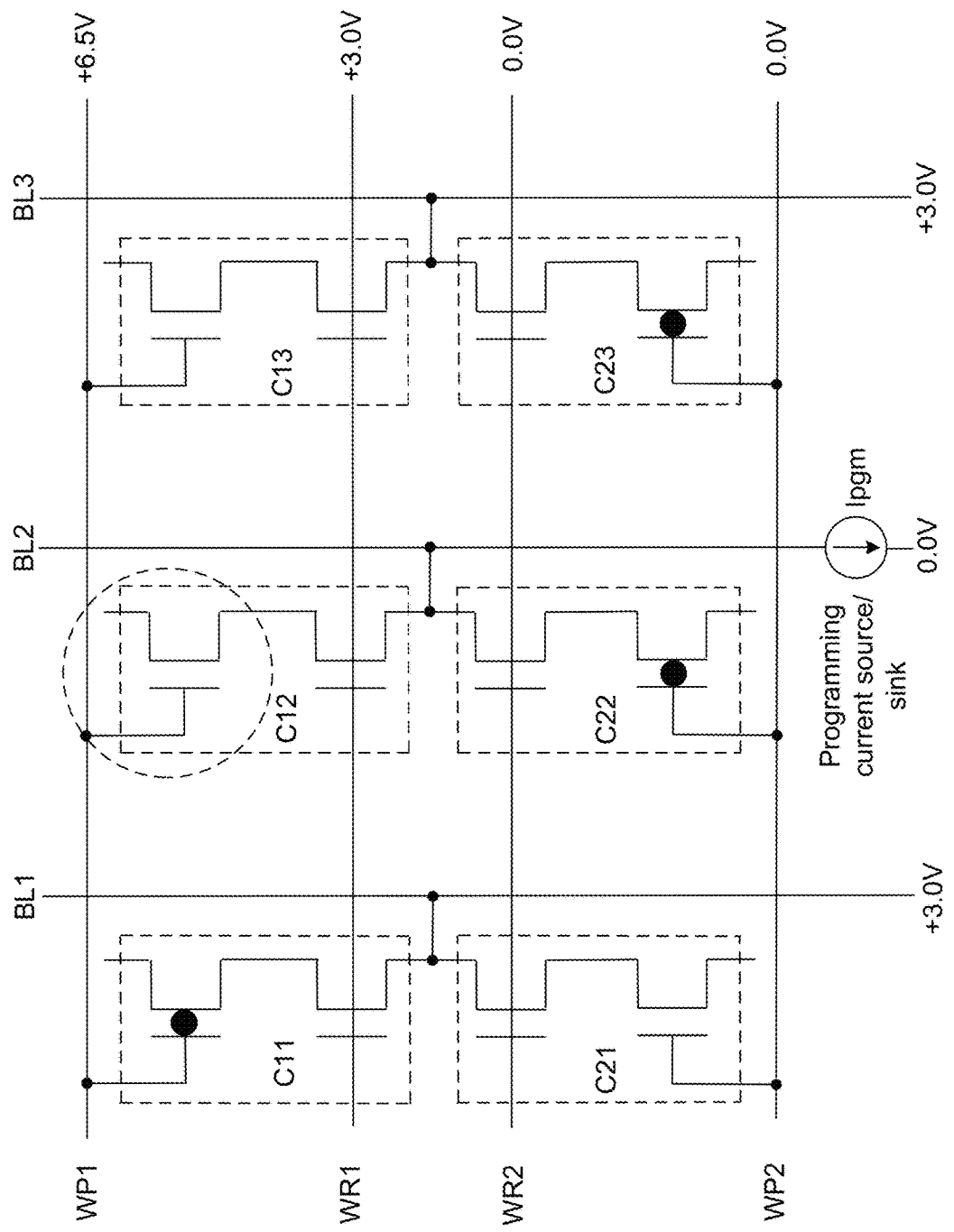
FIG. 2 shows a circuit representation of an anti-fuse memory array being programmed conventionally.

FIG. 2 illustrates current OTP programming methods with an exemplary array of OTP memory cells, part of a larger array of cells. Six memory cells are shown in the array with three vertical bit lines, BL1-BL3, and two pairs of horizontal word lines, WR1-WR2 and WP1-WP2. It should be noted that "vertical" and "horizontal" refer to the drawing directions to better explain the memory cell array. Each OTP memory cell has the gate electrode of its pass transistor connected to a WR line and the gate electrode of its programming element transistor connected to a WP line. Pairs of memory cells are connected in common to the bit lines. Hence memory cells C11 and C21 are connected in common to bit line BL1. As described above, one source/drain of the programming element transistor is left floating and shown without a connection. The other source/drain is also a source/drain of the memory cell's pass transistor.

The drawing shows that three memory cells, C11, C22 and C23, have been programmed. To program a memory cell, the programming word line WP of the selected is raised to some high positive voltage Vpp, the read word line WR of the selected cell set to a voltage about one-half Vpp, termed Vpp2, and the bit line BL of the selected memory cell set to ground, 0 volts. In the example of FIG. 2, the cell selected for programming is memory cell C12. The drawing does not show a voltage source, in this case ground, and selection transistor(s), typically in a decoder circuit which connects the selected memory cell to the voltage source for programming. In this example, the voltage on the programming word line WP1 is raised to +6.5 volts, the read word line WR1 for the gate electrode of the pass transistor is raised to +3.0V, and the bit line BL2 is set at ground, 0 volts. A programming current source or sink provides a programming current Ipgm to the selected memory cell. It should be noted that the programming current increases with Vpp, Ipgm and Vpp2.

While the bit line of the selected memory cell is set at 0 volts, the bit lines for the other cells are set at Vpp2 to prevent leakage by the programmed memory cells (in this example, C11) or to prevent disturbing the unprogrammed memory cells (in this example, C13), which are all connected to the same programming word line as the selected cell. The programming and read word lines for unselected memory cells, in this example, cells C21, C22 and C23, are set to 0 volts. Note that all the voltages are 0 or positive.

In reading the logic state of a memory cell, the gate electrode of the MOSFET programming element of the selected memory cell is raised to a small positive voltage, typically between 0 and 2 volts, while the bit line of the selected memory cell is set to ground. The gate electrode of the MOSFET pass transistor is also turned on and the bit line current flowing through the selected memory cell determines how the logic state of the cell. If the selected memory cell has been programmed, then there should be a definite bit line current; if the cell has not been programmed, there should be no current, except perhaps for small leakage currents.

In an embodiment of the present invention, the selected anti-fuse OTP memory cell is programmed utilizing negative voltage for the bit line of the connected cell. That is, to program a selected memory cell, the programming word line WP of the selected is raised to some high positive voltage but it need not be as high as Vpp in the programming example of FIG. 2. The read word line WR of the selected cell is raised to a voltage not nearly as high as Vpp2 of FIG. 2. The bit line BL of the selected memory cell set to a negative voltage, i.e., below ground.

Figure 3A:
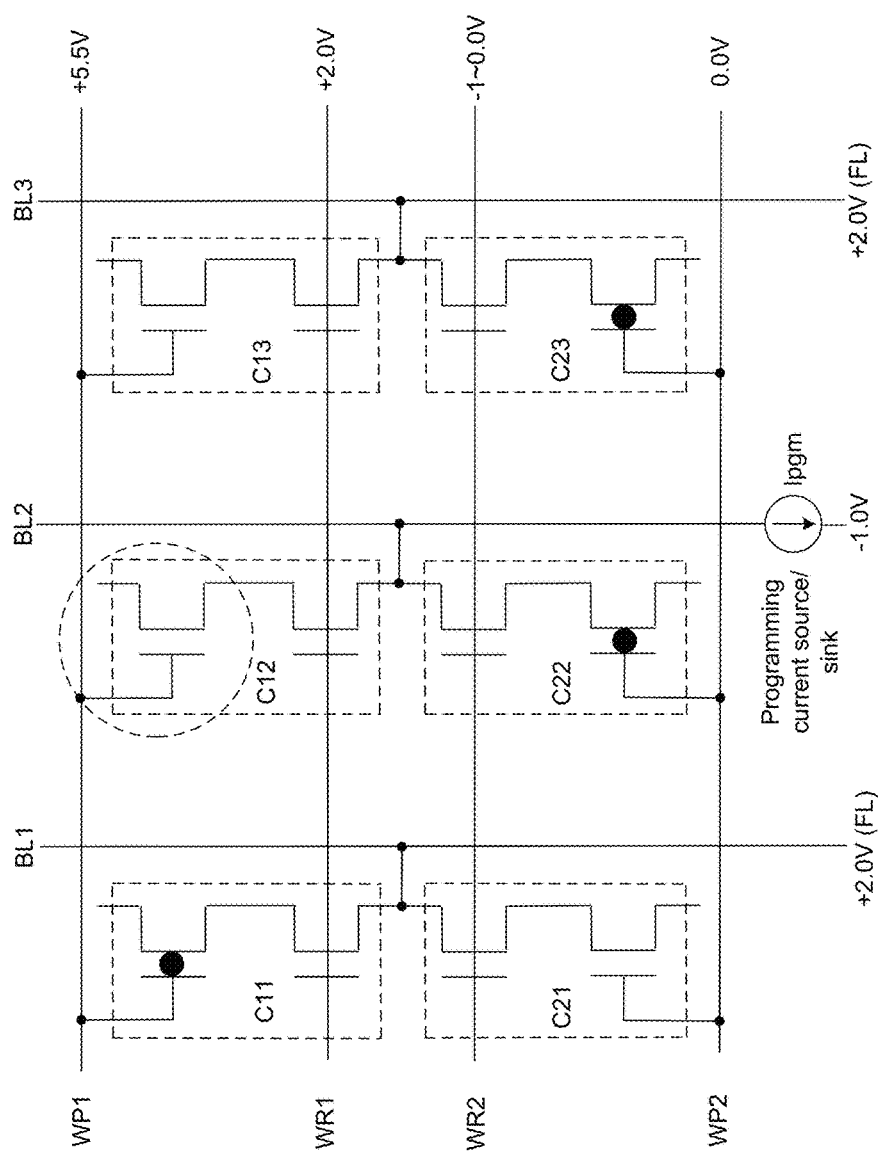
FIG. 3A shows the memory array programming with negative bit line bias, according to one embodiment of the present invention.

FIG. 3A uses the same representative array of FIG. 2 with the selected cell for programming again the memory cell C12. In this case, the voltage on the programming word line WP1 is raised to a voltage between +5.0 to +6.0 volts, preferably +5.5 volts, the read word line WR1 for the gate electrode of the pass transistor is raised to a voltage between +1.5 to +2.5 volts, preferably +2.0 volts, and the bit line BL2 is set in a voltage range below ground, from −1.0 to −2.0 volts (the drawing shows that −1.0 volts is used). A programming current source/sink connected to a programming voltage source at a negative voltage provides a programming current Ipgm to the selected memory cell. For the unselected memory cells the bit lines BL1 and BL3 are set at +2.0 volts (or even floating) and the programming word line WP2 at 0 volts and the read word line WR2 in a range from −1 to 0 volts. To simply explanations, voltage sources and decoders which supply the programming voltages and connect the selected memory cells to the voltage sources (and programming current sources/sinks) are not shown in FIG. 3A (nor in FIG. 2).

Figure 3B:
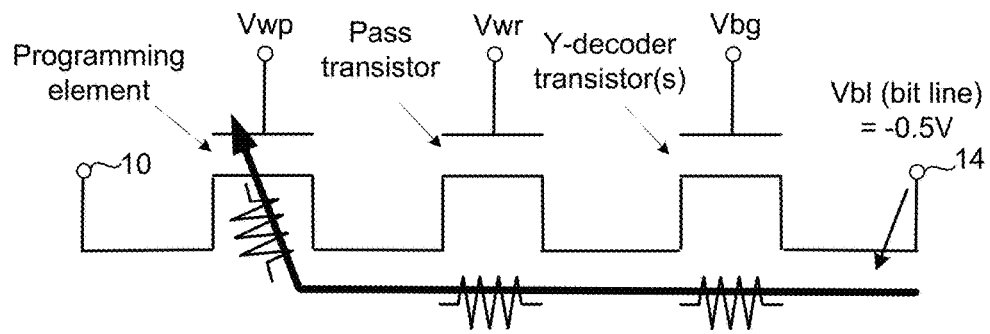
FIG. 3B shows a representation of the channel resistance in programming an anti-fuse memory array according to one embodiment of the present invention.

With the same transistor structures used in the example of FIG. 2, the negative bit line voltages enable a greatly reduced channel resistance for both the pass transistors and Y-decoder transistors (the transistors used to select the bit line for programming) and a higher programmed cell current due to a higher effective Vwp and lower impedance path. This results in faster discrimination of the state of the programming element in the programmed cell, i.e., a faster Read operation of the programmed cell. The various channel resistances, including the resistance for the decoder transistor, are illustrated in FIG. 3B in generalized form. Alternatively, Vpp and Vpp2 can be lowered by approximately the same magnitude as the programming voltage on the bit line has been lowered below ground. This reduces power consumption.

Figure 5:
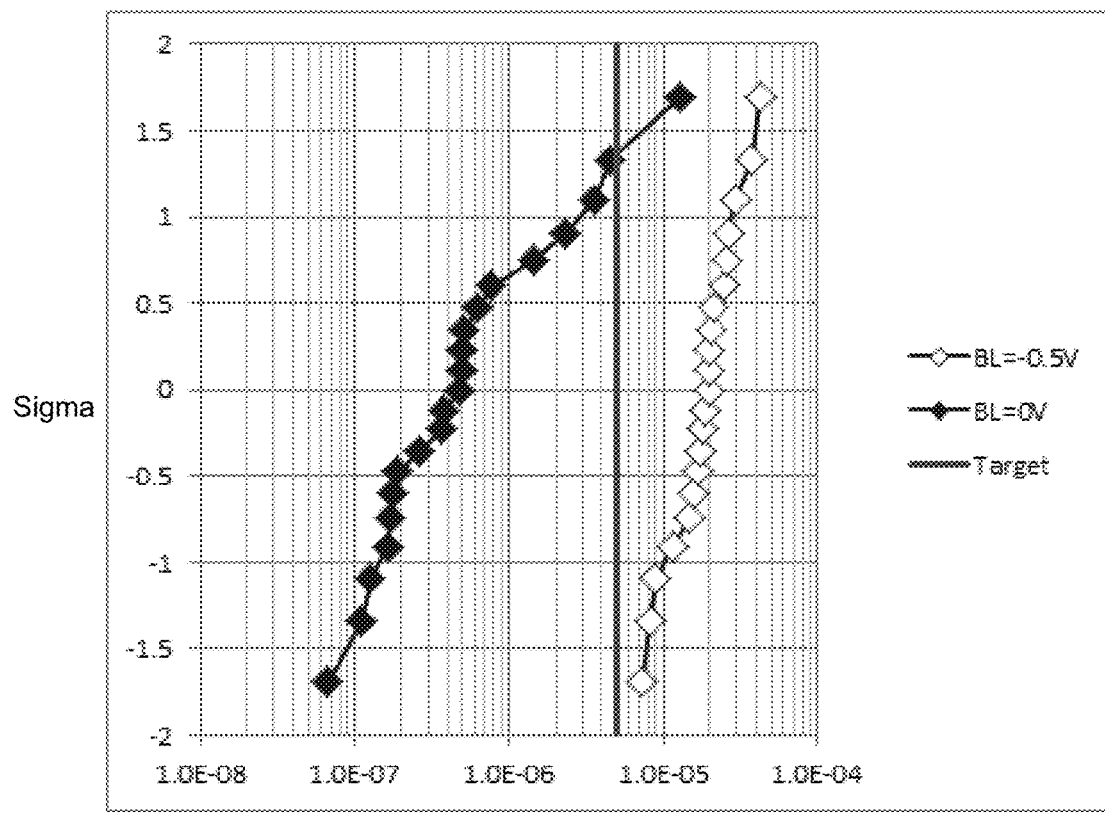
FIG. 5 illustrates the standard deviation of the data from FIGS. 4A and 4B.
Figure 4A:
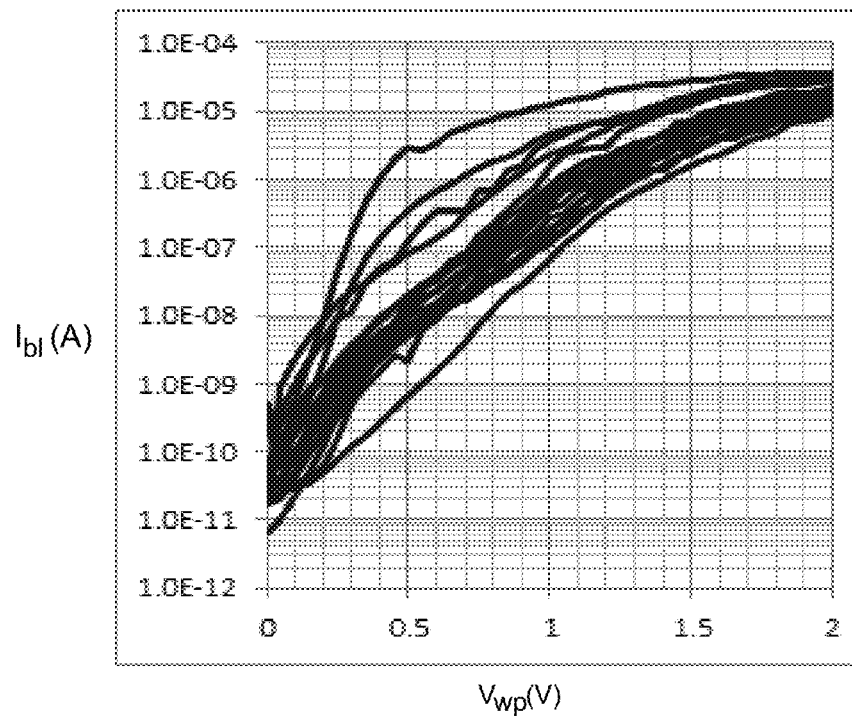
FIG. 4A illustrates data from OTP memory cells in an array programmed conventionally.
Figure 4B:
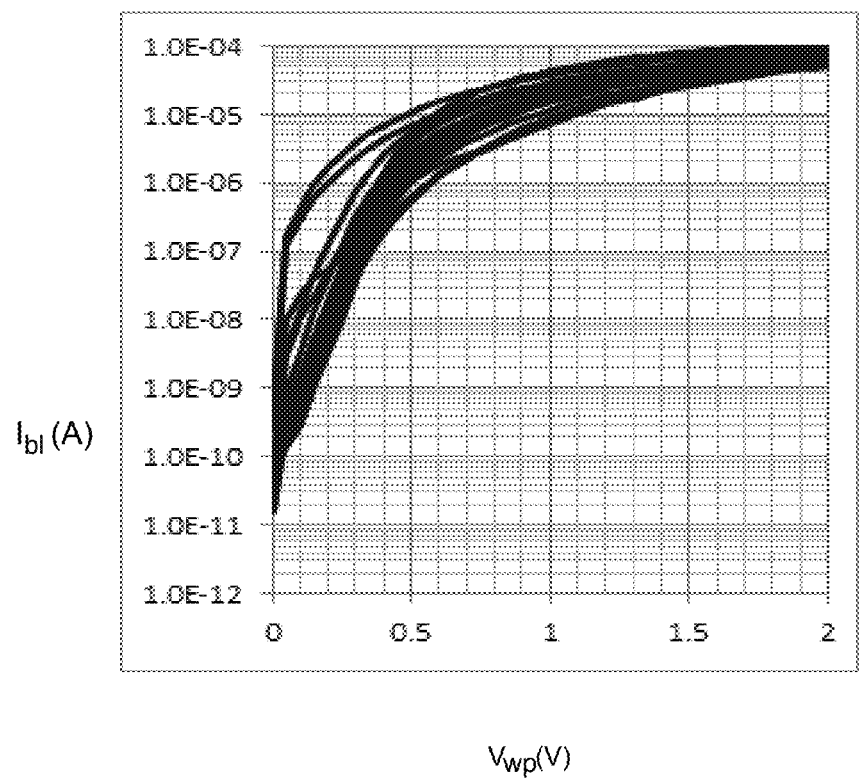
FIG. 4B illustrates data from OTP memory cells in an array programmed according to one embodiment of the present invention.

FIGS. 4A and 4B show the unexpected dependence of the programmed bit line current upon the bit line programming voltage polarity with empirical data. Both graphs show the current-voltage (I-V) curve of OTP memory cells programmed in an array. In FIG. 4A the cells were programmed with the bit line voltage set to ground, i.e., 0 volts, as described with respect to FIG. 2. The programming pulse width was 10 μs. In FIG. 4B the cells were programmed with the bit line voltage set negatively, i.e., −0.5 volts. The programming pulse width was also 10 μs. Programming efficiency was clearly improved with negative programming voltage. It is readily evident that at a particular Vwp, e.g., 1.0 volt, the spread of read (bit line) current Ib1 of the programmed cells is much smaller in FIG. 4B than in FIG. 4A indicating that the negative programming voltage provides for more consistent programming. FIG. 5 shows the standard deviation from the data of FIGS. 4A and 4B with read current measured at Vwp=1.0V. As can be seen in the FIG. 5 graph, the negative programming voltage results are better than targeted. The magnitude of the read current Ib1 of the programmed cells is generally increased with the negative programming pulse. For example, at Vwp=1.0 Volt, the current mean of the programmed cells appears to about 1.0E-05 amperes or greater (FIG. 4B), while the current mean of the current magnitude appears to be less than 1.0E-06 Amperes (FIG. 4A).

Figure 6:
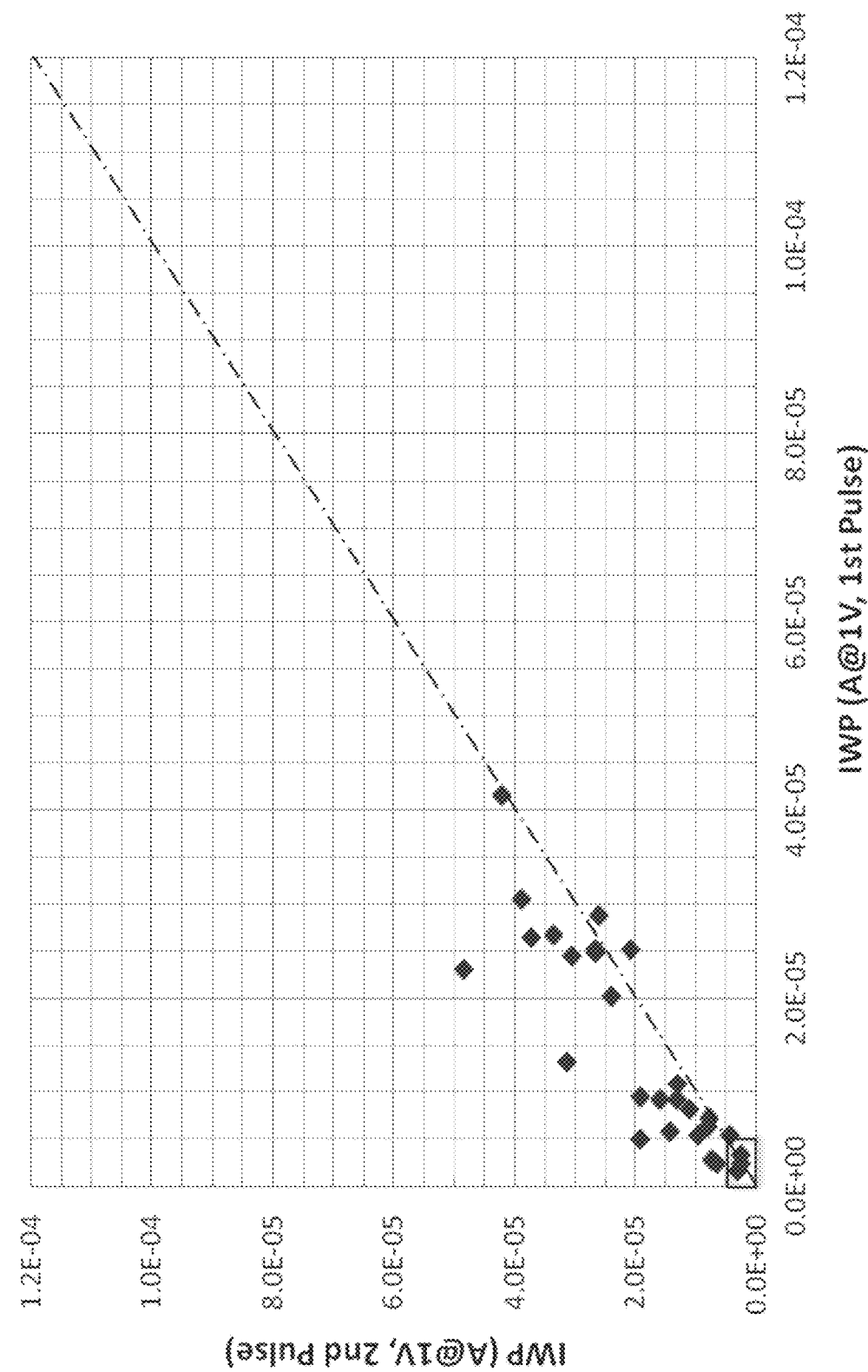
FIGS. 6-8 illustrates comparative data from OTP memory cells in an array programmed conventionally and programmed according to one embodiment of the present invention with a second programming pulse.
Figure 7:
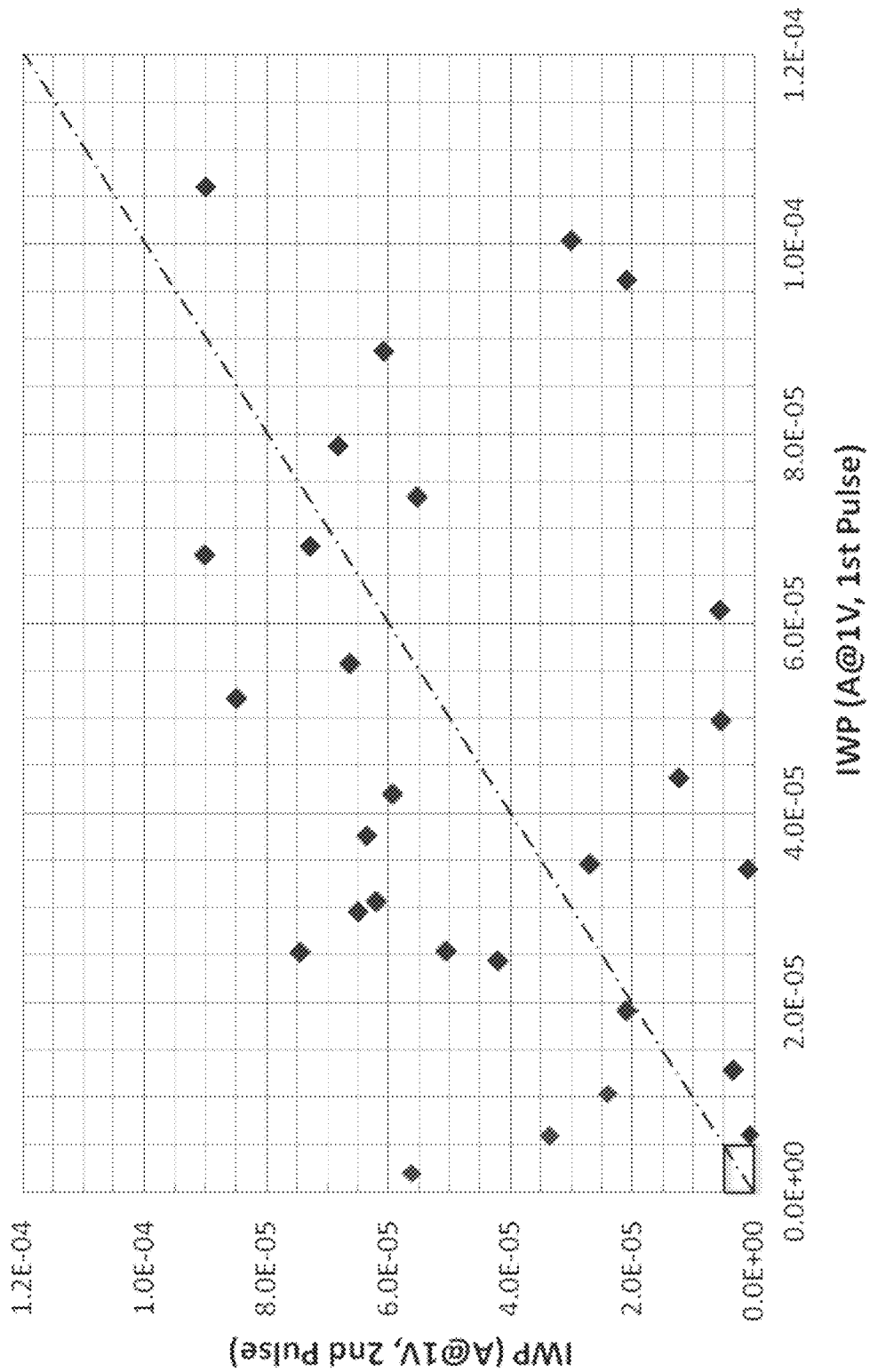
Figure 8:
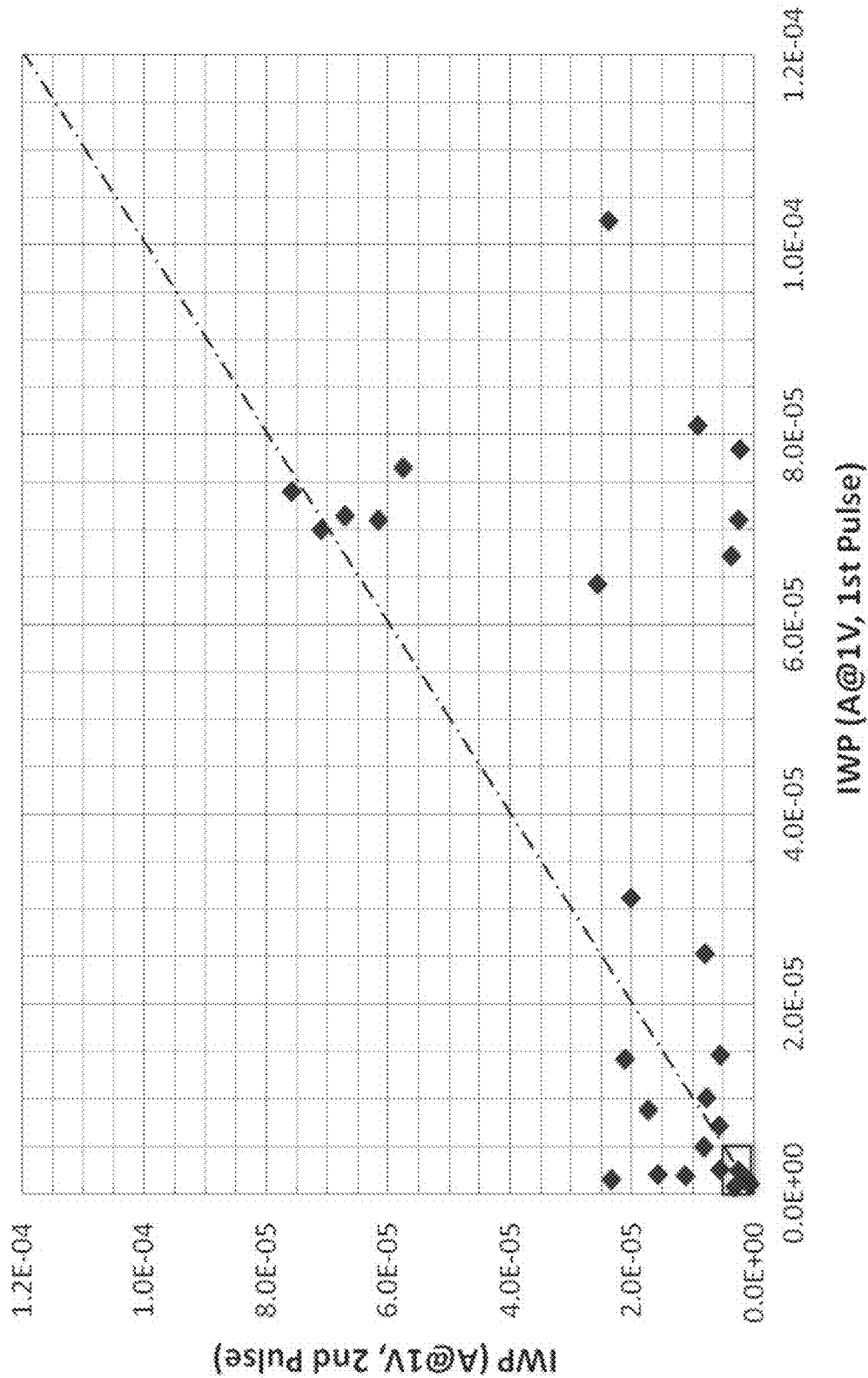

FIGS. 6-8 further illustrate the surprising effectiveness of the negative programming voltage. The graphs in the drawings basically plots the equivalent of the read (bit line) current Ib1 of memory cells which have been programmed twice, that is, subjected to two programming pulses. For these data, the read current was measured through the gate electrode of the programming element at 1V (and the bit line at 0V) for determine a current Iwp. The read current from the cell which has been programmed once provides the horizontal displacement and the resulting read current after the cell has been programmed again provides the vertical displacement. The dotted diagonal line originating at the lower left hand corner of each graph represents locations at which the second programming pulse has no effect upon the read current, i.e., the final read bit current is unchanged from the read bit current after the initial programming pulse. A data point above the diagonal line indicates that read bit current increased with the second programming pulse; and data point below the diagonal line indices that the read bit current decreased with the second pulse.

The memory cells represented in the graph of FIGS. 6 and 8 were programmed with the bit line of the selected memory cell set at 0 volts (FIGS. 6 and 8) and the memory cells in FIG. 7 at a negative voltage. More particularly, the cells in FIG. 6 were programmed with Vwp set at +5.25V, Vwr is 1.8V, Vbg at 1.04V and Vb1 at 0V for a pulse at 8 μs. Vbg represents the gate voltage on the Y-decoder transistor. See the representation shown in FIG. 3B. Under these conventional programming conditions, the additional programming pulse does not significantly change the distribution of read currents. Cell currents which are initially small (<5 μA), i.e., poorly programmed cells, remain so after the second programming pulse. Note the number of cells in the rectangular box at the lower left hand corner of the graph.

Figure 1A:
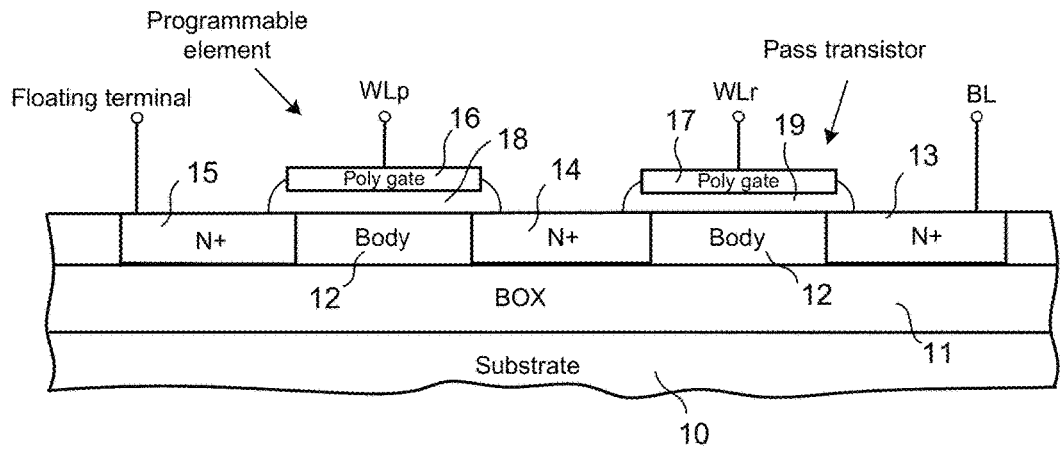
FIGS. 1A and 1B are representative cross-sections of an OTP memory cell in accordance with one embodiment of the present invention.
Figure 1B:
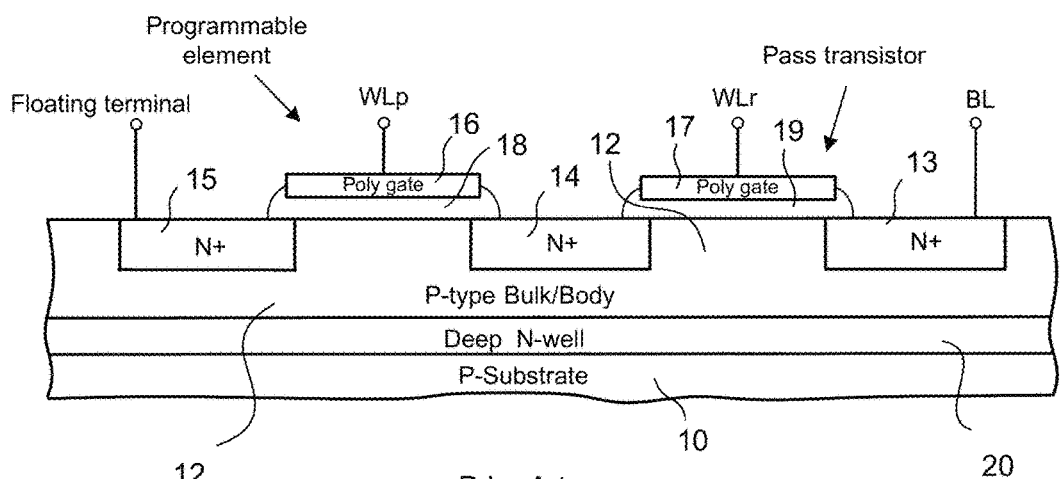

On the other hand, with a negative programming voltage on the bit line, −1.0 volts, and Vwp at 5.25V, Vwr at 1.8V, Vbg at 1.04V for pulses of 8 μs duration, the read bit currents for the cells illustrated by FIG. 7 show the additional second pulse can cause a large bit current change. This is true for both initial current and low current bit samples. Cells with initial currents of less than 5 μA are improved. Note that there are no cells in FIG. 7 with Iwp less than 5 μA after receiving a second pulse. Still another observation from these experiments with negative programming voltages was the body/bulk regions in which the source/drain regions were formed to define the channel regions of the MOSFET transistors of the memory cell could be left electrically floating. See FIGS. 1A and 1B.

Furthermore, even an increase in conventional programming voltage does not provide much better improvement in programmed read bit current distribution. The memory cells of FIG. 8 were programmed with Vb1=0V, Vwp at 6.25V, Vwr at 2.8V, Vbg at 2.04V for pulses of 8 μs duration, an across-the-board increase of 1V. With the increased Vwp and Ipgm some of the programmed cells have large read currents but there still remain cells which are weakly programmed. The second programming pulse does not universally help the cells which were weakly programmed by the first pulse. Some cells with initial currents less than 5 μA are improved by the second pulse but about half of the cells remain unchanged as seen by the cells in the lower left hand rectangle. Additionally, some cells with initial bit line currents greater than 20 μA are degraded after a second pulse.

Hence negative programming voltage provides a marked improvement over conventional programming of OTP memory cells. Read voltages can be significantly lower, down from greater than 2 volts to less than 1 volt, for equal read currents compared to conventionally programmed OTP cells. It is possible that negative programming voltages might provide a power reduction of up to 10 times over comparable conventionally OTP cells.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. In a memory cell having a programmable element and a pass transistor connectable in series to a bit line, a method of programming the memory cell comprising applying a first programming pulse by:
   setting a first voltage of a first polarity on a first gate electrode of the programming element;
   setting a second voltage of the first polarity on a second gate electrode of the pass transistor;
   setting a third voltage on a bit line connected to the pass transistor, the third voltage of a second polarity opposite the first polarity;
   rupturing an oxide layer between the first gate electrode and a channel region of the programming element; and
   applying a second programming pulse including a negative voltage.

2. The method of claim 1 wherein the first polarity is positive.

3. The method of claim 2 wherein the third voltage is −1.0 to −2.0 volts.

4. The method of claim 3 wherein the first voltage is +5.0 to +6.0 volts.

5. The method of claim 4 wherein the second voltage is +1.5 to +2.5 volts.

6. The method of claim 1 wherein the pass transistor comprises the second gate electrode over a channel region between two N-type source/drain regions.

7. The method of claim 1 wherein the programming element comprises a first gate electrode over a channel region contiguous to at least one of the two N-type source/drain regions.

8. The method of claim 1 further comprising:
   allowing a channel region below the first gate electrode of the programming element to electrically float.

9. The method of claim 8 further comprising:
   allowing a channel region below the gate electrode of the pass transistor to electrically float.

10. In an array of one-time programmable (OTP) memory cells, each memory cell having a MOSFET pass transistor with a gate electrode over a channel region between two source/drain regions, and a MOSFET programming element with a gate electrode over a channel region contiguous to a source/drain region either part of, or connected to, one of the two source/drains associated with the MOSFET pass transistor, the other source/drain region of the MOSFET pass transistor coupled to a bit line, a method of programming the memory cell comprising applying a first programming pulse by:
    setting a first voltage of a first polarity on the gate electrode of the pass transistor to electrically connect the source/drain regions of the pass transistor;
    setting a second voltage of the first polarity on the gate electrode of the programming element;
    setting a third voltage of a second polarity on the bit line;
    whereby a voltage across an oxide layer between the gate electrode and channel region of the programming element is created to rupture the oxide layer and program the programming element; and
    applying a second programming pulse including a negative voltage.

11. The method of claim 10 wherein the first polarity is positive with respect to ground and the third polarity is negative with respect to ground.

12. The method of claim 11 wherein the third voltage is in a range between −0.5 to −1.0 volts.

13. The method of claim 12 wherein the first voltage is approximately +5.5 volts.

14. The method of claim 13 wherein the second voltage is approximately +2.0 volts.

15. The method of claim 10 further comprising:
    allowing a channel region below the gate electrode of the programming element to electrically float.

16. The method of claim 10 further comprising:
    allowing a channel region below the gate electrode of the pass transistor to electrically float.

17. A semiconductor device comprising:
    an array of one-time programmable (OTP) memory cells, each memory cell having
       a MOSFET pass transistor having two source/drain regions, and a gate electrode over a channel region between the two source/drain regions;
       a MOSFET programming element having two source/drain regions and a gate electrode over a channel region between the two source/drain regions, one of the source/drain regions either part of, or connected to, one of the two source/drains associated with the MOSFET pass transistor;
    a first word line connected to the gate of the MOSFET pass transistor;
    a second word line connected to the gate electrode of the MOSFET programming element;
    a bit line connected to the source/drain region of the MOSFET pass transistor not part of, nor connected to, a source/drain region of the MOSFET programming element; and
    a negative voltage source coupled to the bit line during a first programming pulse during programming of the memory cell, and again coupled to the bit line during a second programming pulse.

18. The semiconductor device of claim 17 wherein the channel regions of the MOSFET programming element transistors are electrically floating.

19. The semiconductor device of claim 18 wherein the channel regions of the MOSFET pass transistors are electrically floating.

* * * * *